(12) United States Patent
Kameyama et al.

(10) Patent No.: US 7,450,412 B2
(45) Date of Patent: *Nov. 11, 2008

(54) LOGICAL OPERATION CIRCUIT AND LOGICAL OPERATION METHOD

(75) Inventors: Michitaka Kameyama, Sendai (JP); Takahiro Hanyu, Sendai (JP); Hiromitsu Kimura, Ukyo-ku (JP); Yoshikazu Fujimori, Ukyo-ku (JP); Takashi Nakamura, Ukyo-ku (JP); Hidemi Takasu, Ukyo-ku (JP)

(73) Assignee: Rohm Co., Ltd., Kyoto (JP)

( * ) Notice: Subject to any disclaimer, the term of this patent is extended or adjusted under 35 U.S.C. 154(b) by 189 days.

This patent is subject to a terminal disclaimer.

(21) Appl. No.: 10/502,265

(22) PCT Filed: Jan. 22, 2003

(86) PCT No.: PCT/JP03/00568

§ 371 (c)(1),
(2), (4) Date: Jul. 22, 2004

(87) PCT Pub. No.: WO03/065582

PCT Pub. Date: Aug. 7, 2003

(65) Prior Publication Data
US 2005/0146922 A1 Jul. 7, 2005

(30) Foreign Application Priority Data
Jan. 28, 2002 (JP) ............... 2002-018661

(51) Int. Cl.
*G11C 11/00* (2006.01)

(52) U.S. Cl. .......... 365/154; 365/49; 365/145; 365/210; 365/222; 326/104

(58) Field of Classification Search .......... 365/65, 365/145, 49, 154, 210; 326/38, 104, 52, 326/54
See application file for complete search history.

(56) References Cited

U.S. PATENT DOCUMENTS 5,038,323 A * 8/1991 Schwee ............ 365/145
5,821,578 A * 10/1998 Shimoji ............ 257/295

(Continued)

OTHER PUBLICATIONS

Kimura, et al., "Ferroelectric-Based Functional Pass-Gate for Low-Power VLSI", 2002 Symposium On VLSI Circuits Digest of Technical Papers, pp. 196-199, Japan, no month.

*Primary Examiner*—Vibol Tan
(74) *Attorney, Agent, or Firm*—Hogan & Hartson LLP

(57) ABSTRACT

To provide a logical operation circuit which can perform a logical operation using a ferroelectric capacitor and a logical operation method. A logical operation circuit 1 has a ferroelectric capacitors CF and a transistor MP. The ferroelectric capacitor CF can retain a polarization state P1 (y=1) or P2 (y=0) corresponding to first operation target data y. In an operation process, a first terminal 3 of the ferroelectric capacitor 1 is precharged to a source potential Vdd, and a potential corresponding to second operation target data x, that is, a ground potential GND (x=1) or the source potential Vdd (x=0), is given to a second terminal 5 of the ferroelectric capacitor via a bit line BL. When the threshold voltage Vth of the transistor MP is set properly, the transistor MP becomes on or off (on, on, on, off) depending on the combination of x and y (0-0, 0-1, 1-0, 1-1).

12 Claims, 12 Drawing Sheets

U.S. PATENT DOCUMENTS

| | | | |
|---|---|---|---|
| 5,930,161 A * | 7/1999 | Sheikholeslami et al. | 365/49.13 |
| 5,982,683 A | 11/1999 | Watson et al. | |
| 6,903,572 B2 * | 6/2005 | Nozawa et al. | 326/41 |
| 6,924,663 B2 * | 8/2005 | Masui et al. | 326/38 |
| 2003/0169071 A1 * | 9/2003 | Nozawa et al. | 326/38 |
| 2005/0017757 A1 * | 1/2005 | Fujimori | 326/104 |

* cited by examiner

Fig. 6A

| x | y | ML |
|---|---|---|
| 0 (BL=5V) | 0 | 0 |
| 0 (BL=5V) | 1 | 0 |
| 1 (BL=0V) | 0 | 0 |
| 1 (BL=0V) | 1 | 1 |

Fig. 6B

| x | y | ML |
|---|---|---|
| 1 (BL=5V) | 1 | 0 |
| 1 (BL=5V) | 0 | 0 |
| 0 (BL=0V) | 1 | 0 |
| 0 (BL=0V) | 0 | 1 |

(IC1, IC2) = (0, 0)

(IC1, IC2) = (1, 0)

(IC1, IC2) = (0, 1)

(IC1, IC2) = (1, 1)

LOGICAL OPERATION CIRCUIT AND LOGICAL OPERATION METHOD

CROSS-REFERENCE TO RELATED APPLICATIONS

The entire disclosure of Japanese Patent Application No. 2002-18661 filed on Jan. 28, 2002 including their specification, claims, drawings and summary are incorporated herein by reference in its entirety.

TECHNICAL FIELD

This invention relates to a logical operation circuit and a logical operation method and, more particularly, to a logical operation circuit, a logical operation device and a logical operation method using a non-volatile memory element such as a ferroelectric capacitor.

BACKGROUND ART

A non-volatile memory is known as a circuit using a ferroelectric capacitor. It is possible to realize a rewritable non-volatile memory which can operate on a low voltage by using a ferroelectric capacitor.

However, such a conventional circuit cannot perform a logical operation on data even if it can store data.

DISCLOSURE OF THE INVENTION

The object of this invention is to solve the problem of a conventional circuit using a ferroelectric capacitor and to provide a logical operation circuit and a logical operation device which can perform a logical operation using a non-volatile memory element such as a ferroelectric capacitor and a logical operation method using the logical operation circuit or the logical operation device.

A logical operation circuit according to this invention comprises: a ferroelectric capacitor; a first signal line; a second signal line; and an operation result output section. The ferroelectric capacitor can retain a polarization state corresponding to first operation target data, and has first and second terminals. The first signal line is connected to the first terminal of the ferroelectric capacitor. The second signal line can provide second operation target data to the second terminal of the ferroelectric capacitor retaining the polarization state corresponding to the first operation target data, and is connected to the second terminal of the ferroelectric capacitor. The operation result output section can output the result of a logical operation on the first and second operation target data based on a polarization state of the ferroelectric capacitor generated by providing the second operation target data to the ferroelectric capacitor, and is connected to the first signal line.

A logical operation circuit according to this invention comprises: a ferroelectric capacitor having first and second terminals; first and second signal lines connected to the first and second terminals, respectively; and an output transistor. The output transistor is an electric field effect transistor which has a gate terminal connected to the first signal line and an output terminal for outputting an output signal corresponding to a control signal inputted into the gate terminal, and which becomes off when a potential on a first reference potential side from its threshold voltage is given as the control signal and becomes on when a potential on a second reference potential side from its threshold voltage is given as the control signal. In the logical operation circuit, the following operation is performed: The first and second signal lines are connected to one of the first and second reference potentials and the other of the first and second potentials, respectively, to generate a polarization state corresponding to first operation target data in the ferroelectric capacitor. The first and second signal lines are then both connected to the second reference potential to precharge the first signal line to the second reference potential without causing a change in the residual polarization state of the ferroelectric capacitor. Then, the application of voltage to the first signal line is stopped and the second signal line is connected to the first or second reference potential corresponding to second operation target data, and an output signal produced at the output terminal of the output transistor in response to a potential which is generated in the first signal line when the second signal line is connected to the first or second reference potential corresponding to the second operation target data is obtained as the result of a logical operation on the first and second operation target data.

A logical operation circuit according to this invention comprises: a non-volatile memory element which can retain a non-volatile state corresponding to first operation target binary data y and which has first and second terminals; and an operation result output section which outputs, based on a state of the non-volatile memory element generated by providing second operation target binary data x to the second terminal of the non-volatile memory element, the result of a logical operation on the first and second operation target binary data x and y as operation result binary data z. The operation result binary data z substantially satisfies the following relation:

z=x AND y.

A logical operation circuit according to this invention comprises: a non-volatile memory element which can retain a non-volatile state corresponding to first operation target data; and an operation result output section which outputs, based on a state of the non-volatile memory element generated by providing second operation target data to the non-volatile memory element, the result of a logical operation on the first and second operation target data and which is connected to a first terminal of the non-volatile memory element.

A logical operation method comprising the steps of: causing a first ferroelectric capacitor having first and second terminals to retain a polarization state corresponding to first operation target data; charging the first terminal of the ferroelectric capacitor retaining the polarization state to a specified reference potential; and obtaining, based on a polarization state of the ferroelectric capacitor generated by providing second operation target data to the second terminal of the ferroelectric capacitor with the first terminal of the ferroelectric capacitor charged to the specified reference potential, the result of a logical operation on the first and second operation target data.

Although the features of this invention can be expressed as above in a broad sense, the constitution and content of this invention, as well as the object and features thereof, will be apparent with reference to the following disclosure, taken in connection with the accompanying drawings.

BRIEF DESCRIPTION OF THE DRAWINGS

FIG. 6A is a table showing the relation among first and second operation target data y1 and y2 and the value of an output line ML when the logical operation circuit 1 is caused to perform a logical operation "ML=x AND y";

FIG. 6B is a table showing the relation among first and second operation target data y1 and y2 and the value of an output line ML when the logical operation circuit 1 is caused to perform a logical operation "ML=x NOR y";

BEST MODE FOR CARRYING OUT THE INVENTION

Figure 1:
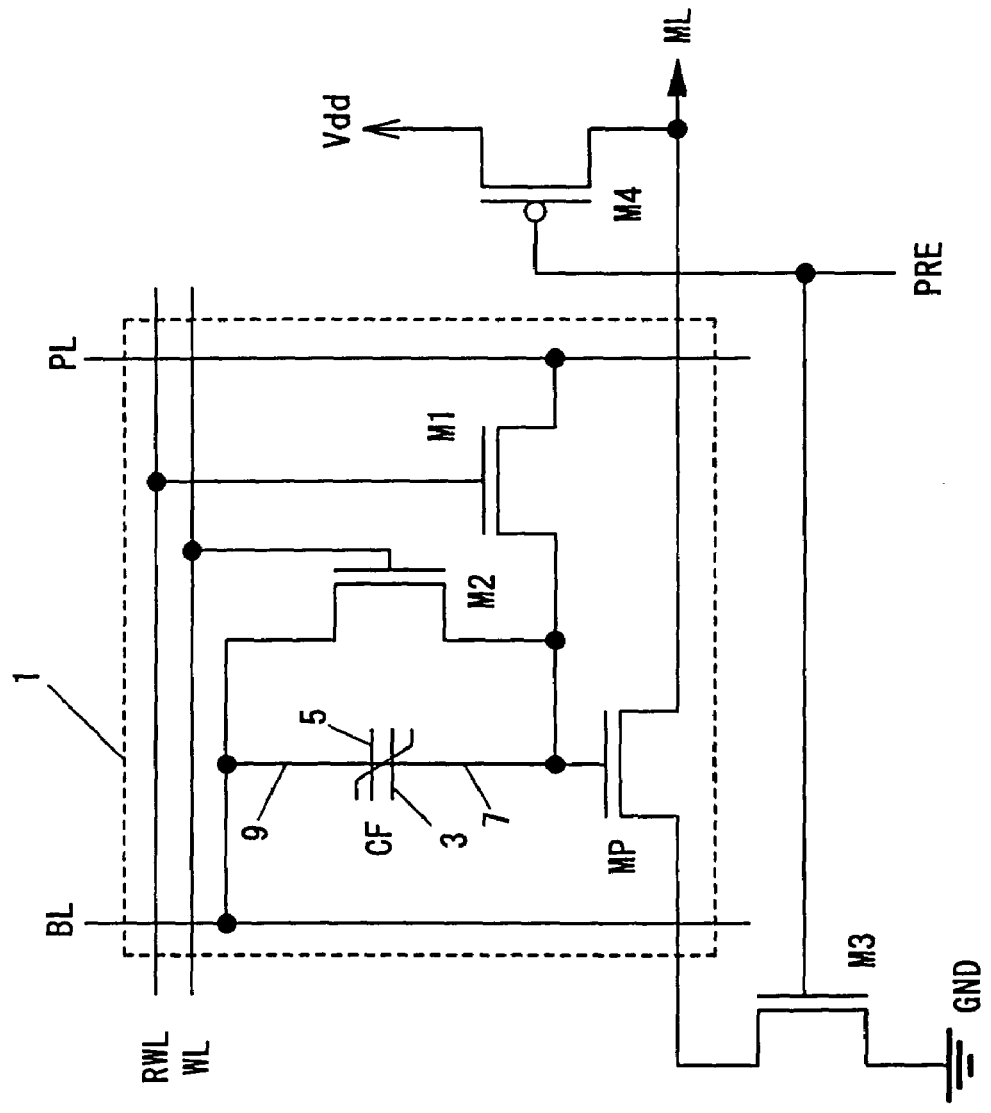
FIG. 1 is a circuit diagram illustrating a logical operation circuit 1 according to an embodiment of this invention.

FIG. 1 is a circuit diagram illustrating a logical operation circuit 1 according to an embodiment of this invention. The logical operation circuit 1 comprises a ferroelectric capacitor CF, a transistor MP as an output transistor, and transistors M1 and M2. The transistors MP, M1 and M2 are N-channel MOSFETs (metal oxide semiconductor field effect transistors).

The ferroelectric capacitor CF has a first terminal 3 connected to a first signal line 7, and a second terminal 5 connected to a second signal line 9. The first signal line 7 is connected to a gate terminal of the transistor MP.

The first signal line 7 is connected to a plate line PL via the transistor M1 and to the second signal line 9 via the transistor M2. The transistors M1 and M2 have gate terminals connected to a read/write line RWL and a word line WL, respectively.

The transistor MP has an input terminal connected to a ground potential GND as a first reference potential via the transistor M3, and an output terminal connected to an output line ML. The output line ML is connected to a source potential Vdd as a second reference potential via the transistor M4. The transistors M3 and M4 have gate terminals connected to a preset line PRE.

The transistor M3 is an N-channel MOSFET (metal oxide semiconductor field effect transistor), and the transistor M4 is a P-channel MOSFET (metal oxide semiconductor field effect transistor).

Figure 9A:
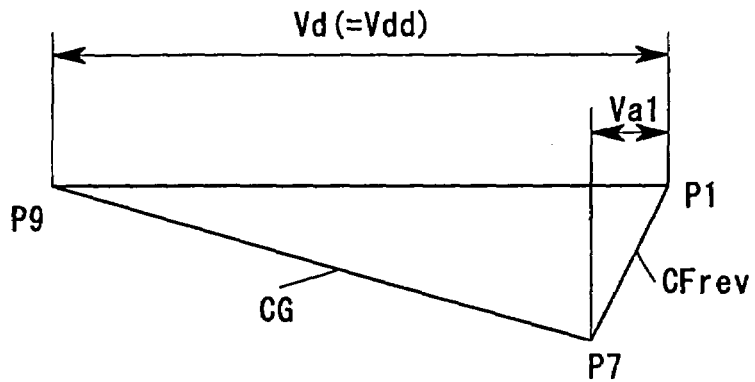
FIG. 9A and FIG. 9B are views used to explain the relation among the characteristics of the ferroelectric capacitor CF and a transistor MP in the first embodiment.
Figure 9B:
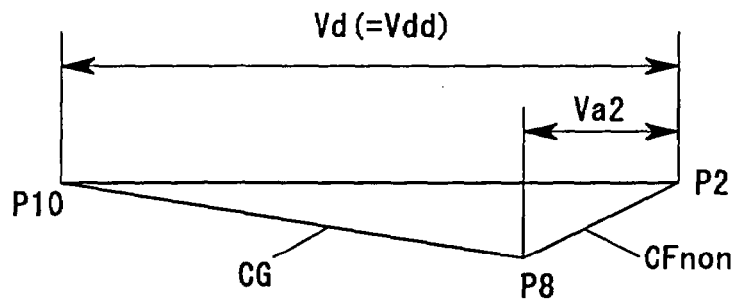

FIG. 9A and FIG. 9B are views used to explain the relation among the characteristics of the ferroelectric capacitor CF and the transistor MP. FIG. 9A and FIG. 9B are enlarged views of a part of FIG. 5B, which illustrates the polarization state of the ferroelectric capacitor during an operation.

In the drawings, Vd: the absolute value of the difference between the ground potential GND as a first reference potential and the source potential Vdd as a second reference potential, CG: the gate capacitance of the output transistor MP, CFrev: the average capacitance of the ferroelectric capacitor in the inversion direction, CFnon: the average capacitance of the ferroelectric capacitor in the non-inversion direction, Va1: the absolute value of the difference between the potential which is generated at the gate terminal of the output transistor CG and the ground potential GND as a first reference potential when first operation target data y=1 (which corresponds to the polarization state P1 of the ferroelectric capacitor CF) and second operation target data X=1 (which corresponds to the state in which a bit line BL is connected to the ground potential GND), and Va2: the absolute value of the difference between the potential which is generated at the gate terminal of the output transistor MP and the ground potential GND as a first reference potential when first operation target data y=0 (which corresponds to the polarization state P2 of the ferroelectric capacitor CF) and second operation target data x=1 (which corresponds to the state in which the bit line BL is connected to the ground potential GND).

As can be understood from FIG. 9A, $$Va1 = CG \cdot Vd/(CFrev+CG). \quad (1)$$

Similarly, from FIG. 9B, $$Va2 = CG \cdot Vd/(CFnon+CG). \quad (2)$$

As described later, the threshold voltage of the transistor MP is set such that the transistor MP becomes off when y=1 and x=1 and becomes on when y=0 and x=1. That is, $$Va1 < Vath < Va2. \quad (3)$$

From the relations (1) to (3), the following relation is obtained:

$$CFnon/CG+1 < Vd/Vath < CFrev/CG+1. \quad (4)$$

In this embodiment, the absolute value Vath of the difference between the threshold voltage of the output transistor MP and the ground potential GND as a first reference potential is smaller than the coercive electric field Vc of the ferroelectric capacitor CF. In this case, even when the polarization state of the ferroelectric capacitor CF is shifted toward an inversion by an operation, in other words, when the output transistor MP becomes OFF in response to the result of the operation at the time when y=1 and x=1, the ferroelectric capacitor CF does not undergo a polarization inversion.

As described above, in this embodiment, the characteristics of the ferroelectric capacitor CF and the transistor MP are determined such that the absolute value Vath of the difference between the threshold voltage of the output transistor MP and the ground potential GND as a first reference potential is smaller than the coercive electric field Vc of the ferroelectric capacitor CF and satisfies the relation (4). Thus, a logical operation can be performed on first operation target data y and second operation target data x with a residual polarization corresponding to the first operated target data maintained, that is, without destroying the first operation target data y.

Even if the absolute value Vath of the difference between the threshold voltage of the output transistor MP and the ground potential GND as a first reference potential is not smaller than the coercive electric field Vc of the ferroelectric capacitor CF, a logical operation can be performed on first operation target data y and second operation target data x with a residual polarization corresponding to the first operation target data maintained, that is, without destroying the first operation target data y. The conditions for it will be described below.

The marginal conditions under which the ferroelectric capacitor CF does not undergo a polarization inversion when the polarization state of the ferroelectric capacitor CF is shifted toward an inversion by an operation, that is, when y=1 and x=1, will be described with FIG. 9C.

In the drawing, Vd: the absolute value of the difference between the ground potential GND as a first reference potential and the source potential Vdd as a second reference potential, CGc: the gate capacitance of the output transistor CG at the limit at which the ferroelectric capacitor CF does not undergo a polarization inversion, Vc: the coercive electric field of the ferroelectric capacitor CF, and Pr: a residual polarization of the ferroelectric capacitor CF.

Figure 9C:
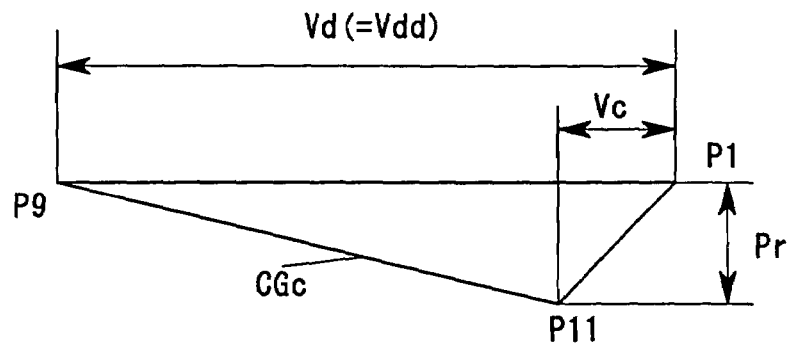
FIG. 9C is a view used to explain the limit conditions under which the ferroelectric capacitor CF does not undergo a polarization inversion in another embodiment.

As can be understood from FIG. 9C, $$CGc=Pr/(Vd-Vc) \quad (5)$$

Not to cause a polarization inversion of the ferroelectric capacitor CF even when the polarization state of the ferroelectric capacitor CF is shifted toward an inversion by an operation, that is, when y=1 and x=1, the gate capacitance CG of the output transistor CG must be:

$$CG<=CGc. \quad (6)$$

From the relations (5) and (6), $$CG<=Pr/(Vd-Vc). \quad (7)$$

Since the absolute value Vath of the difference between the threshold voltage of the output transistor MP and the ground potential GND as a first reference potential is not smaller than the coercive electric field Vc of the ferroelectric capacitor CF from the given condition, it is apparent that the output transistor MP becomes off when y=1 and x=1.

To cause the output transistor MP to become on when y=0 and x=1, the following relation must be satisfied as is the case shown in FIG. 9B:

$$CFnon/CG+1<Vd/Vath \quad (8)$$

That is, when the above relations (7) and (8) are satisfied, even if the absolute value Vath of the difference between the threshold voltage of the output transistor MP and the first reference potential is not smaller than the coercive electric field Vc of the ferroelectric capacitor CF, a logical operation can be performed on the first operation target date y and the second operation target date x with the polarization state corresponding to the first operation target data maintained, that is, without destroying the first operation target data y.

Figure 2:
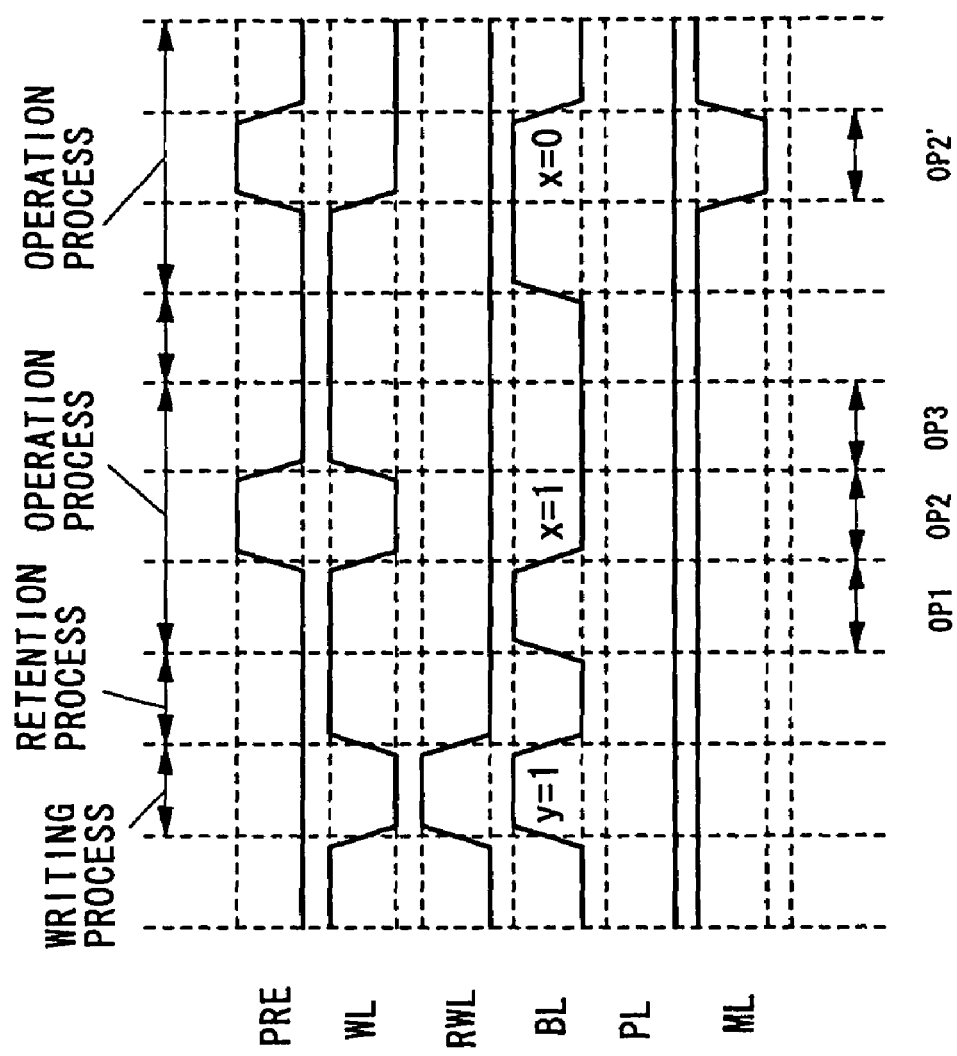
FIG. 2 is a timing diagram illustrating the operation of the logical operation circuit 1.

Description will be made of the operation of the logical operation circuit 1. FIG. 2 is a timing diagram illustrating the operation of the logical operation circuit 1.

In a writing process, an "L" potential (that is, the ground potential GDD as a first reference potential) and an "H" potential (that is, the source potential Vdd as a second reference potential) are given to the word line WL and the read/write line RWL, respectively. The first operation target data y and /y (inversion data of y) are given to the bit line BL and the plate line PL, respectively. In this embodiment, when y=1, "H" and "L" are given to the bit line BL and the plate line PL, respectively. Thus, in the writing process shown in FIG. 2, y=1 is given as the first operation target data. The negation of a binary number (binary signal) "A" (inversion signal) is represented as "/A", unless otherwise stated.

Figure 3A:
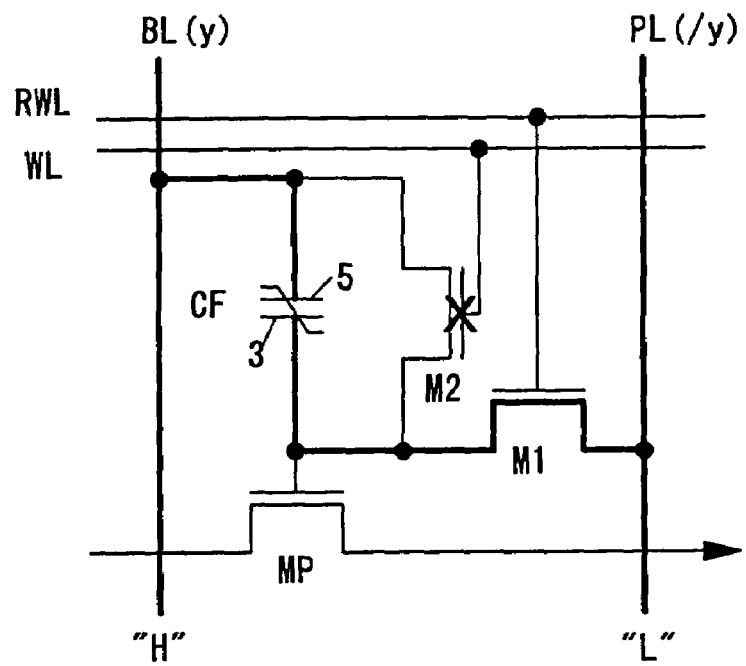
FIG. 3A is a view illustrating the state of the logical operation circuit 1 during a writing process.
Figure 3B:
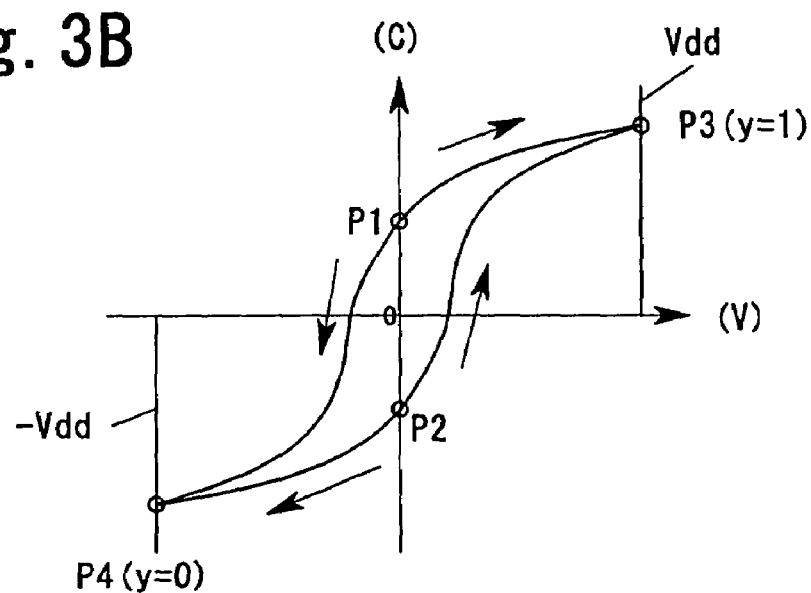
FIG. 3B is a graph illustrating the polarization state of a ferroelectric capacitor CF during the writing process.

FIG. 3A is a view illustrating the state of the logical operation circuit 1 during the writing process, and FIG. 3B is a graph illustrating the polarization state of the ferroelectric capacitor CF during the writing process. As shown in FIG. 3A, the transistors M2 and M1 are off and on, respectively, and "L" and "H" are applied to the first terminal 3 and the second terminal 5, respectively, of the ferroelectric capacitor CF.

At this time, the ferroelectric capacitor CF exhibits a polarization state P3 as shown in FIG. 3B. When y=0 is given as the first operation target data, however, the ferroelectric capacitor CF exhibits a polarization state P4.

Since an "L" is given to the preset line PRE in this process as shown in FIG. 2, the transistors M3 and M4 are off and on, respectively. Thus, the output line ML has an "H".

As shown in FIG. 2, the writing process is followed by a retention process. In the retention process, "H" and "L" are given to the word line WL and the read/write line RWL, respectively, and an "L" is given to both the bit line BL and the plate line PL.

Figure 4A:
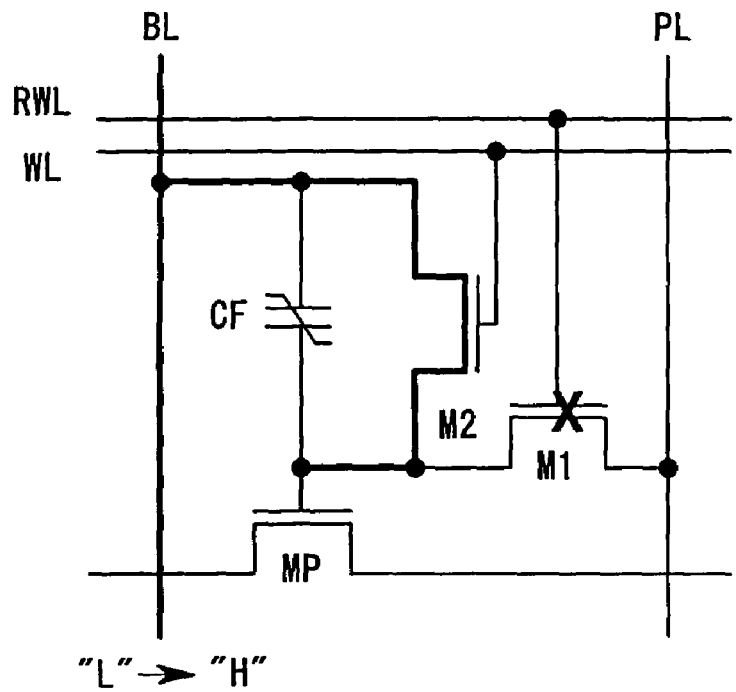
FIG. 4A is a view illustrating the state of the logical operation circuit 1 during a retention process and a first stage OP1 of an operation process.
Figure 4B:
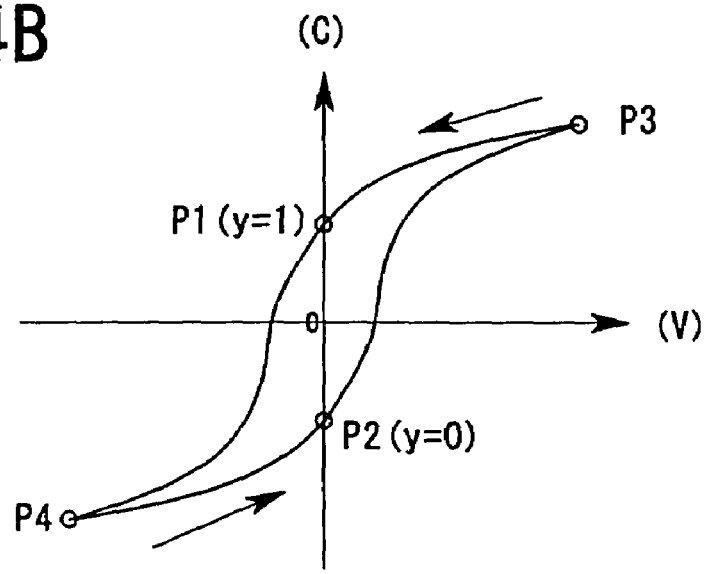
FIG. 4B is a graph illustrating the polarization state of a ferroelectric capacitor CF during the retention process and the first stage OP1 of the operation process.

FIG. 4A is a view illustrating the state of the logical operation circuit 1 during the retention process, and FIG. 4B is a graph illustrating the polarization state of the ferroelectric capacitor CF during the retention process. As shown in FIG. 4A, the transistors M2 and M1 are on and off, respectively, and an "L" is applied to both the first terminal 3 and the second terminal 5 of the ferroelectric capacitor CF.

At this time, the ferroelectric capacitor CF exhibits a polarization state P1 as shown in FIG. 4B. When y=0 has been given as the first operation target data, however, the ferroelectric capacitor CF exhibits a polarization state P2.

Also in this process, since an "L" is given to the preset line PRE as shown in FIG. 1, the transistors M3 and M4 are off and on, respectively. Thus, the output line ML has an "H".

As shown in FIG. 2, the retention process is followed by an operation process. The operation process is divided into a first stage OP1, a second stage OP2 and a third stage OP3. In the first stage OP1 of the operation process, a process similar to the retention process is performed. This process is, however, different from the retention process in that an "H" is given to the bit line BL.

The first stage OP1 of the operation process can be explained using FIG. 4A and FIG. 4B, which illustrate the retention process. That is, as shown in FIG. 4A, in the first stage OP1 of the operation process, the transistors M2 and M1 are on and off, respectively. However, an "H" is applied to both the first terminal 3 and the second terminal 5 of the ferroelectric capacitor CF. By this process, the first terminal 3, that is, the gate capacitance CG of the transistor MP is precharged to the source potential Vdd.

At this time, as shown in FIG. 4B, the ferroelectric capacitor CF exhibits a polarization state P1 as in the case with the retention process. When y=0 has been given as the first operation target data, however, the ferroelectric capacitor CF exhibits a polarization state P2.

Also in this process, since an "L" is given to the preset line PRE as shown in FIG. 1, the transistors M3 and M4 are off and on, respectively. Thus, the output line ML has an "H".

As shown in FIG. 2, the first stage OP1 of the operation process is followed by the second stage OP2. In the second stage OP2, an "L" is given to both the word line WL and the read/write line RWL, and second operation target data x are given to the bit line BL. In this embodiment, when x=1, an "L" is given to the bit line BL. Thus, in the second stage OP2 of the operation process shown in FIG. 2, x=1 is given as the second operation target data. An "L" is given to the plate line PL.

Figure 5A:
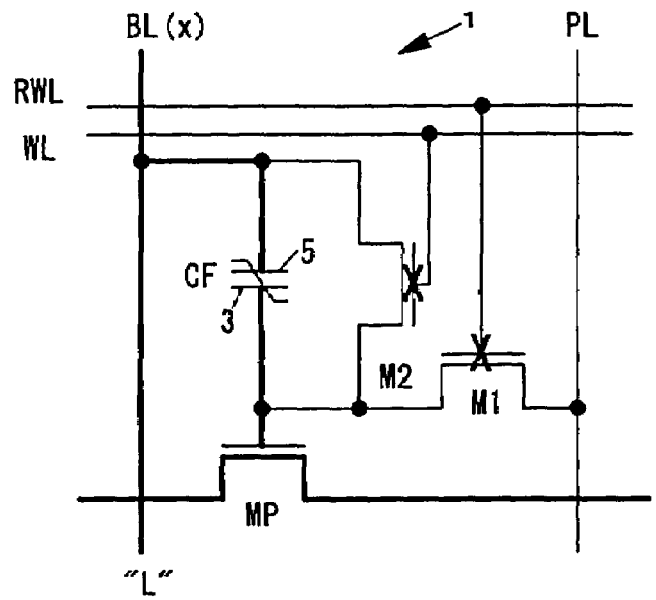
FIG. 5A is a view illustrating the state of the logical operation circuit 1 during a second stage OP2 of the operation process.
Figure 5B:
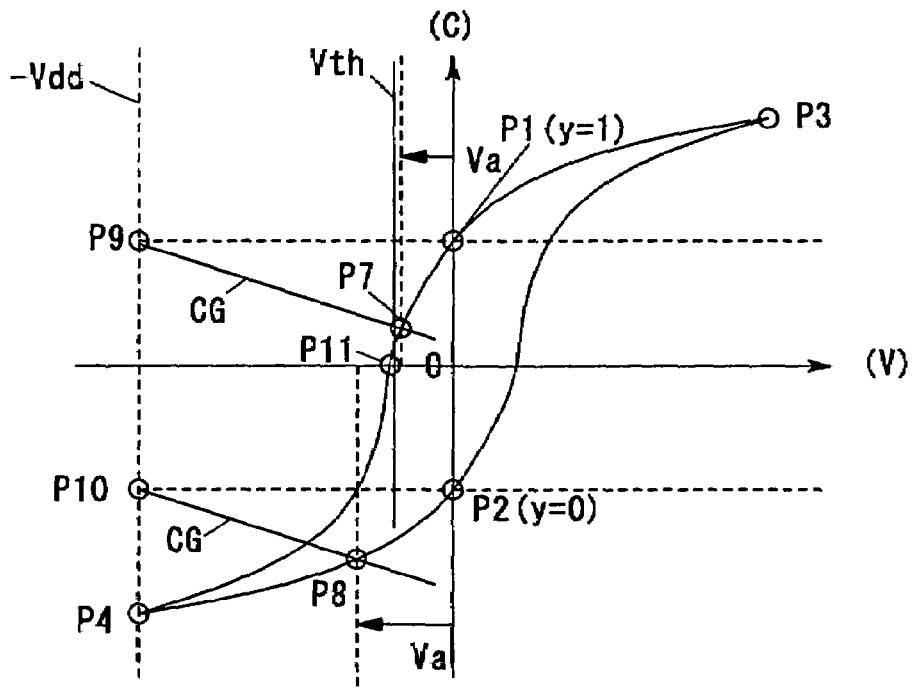
FIG. 5B is a graph illustrating the polarization state of a ferroelectric capacitor CF during a second stage OP2 of the operation process.

FIG. 5A is a view illustrating the state of the logical operation circuit during the second stage OP2 of the operation process, and FIG. 5B is a graph illustrating the polarization state of the ferroelectric capacitor CF during the second stage OP2 of the operation process. As shown in FIG. 5A, the transistors M2 and M1 are both off, and an "L" is applied to the second terminal 5 of the ferroelectric capacitor CF.

According to a graphical analysis, the polarization state of the ferroelectric capacitor CF is shifted from P1 to P7 at this time as shown in FIG. 5B. At this time, the state of the gate capacitance CG of the transistor MP is shifted from P9 to P7. That is, the potential Va at the gate terminal of the transistor MP is changed from Vdd to the difference between P1 and P7 (which is equal to Va1 mentioned before).

In this case, the transistor MP becomes off since the absolute value Vath (which is equal to Vth in this embodiment) of the difference between the threshold voltage Vth of the transistor MP and the ground potential GND is set to satisfy the relation (3) as described before.

When y=0 has been given as the first operation target data, however, the polarization state of the ferroelectric capacitor CF is shifted from P2 to P8. At this time, the state of the gate capacitance GC of the transistor MP is shifted from P10 to P8. That is, the potential Va at the gate terminal of the transistor MP is changed from Vdd to the difference between P2 and P8 (which is equal to the Va2 mentioned before). As a result, the transistor MP becomes on, in contrast to when y=1.

When y=1 has been given as the first operation target data and x=0 is given as the second operation target data (the process represented as OP2' in the operation process in FIG. 2), the polarization state of the ferroelectric capacitor CF is maintained at P1 as shown in FIG. 5B. At this time, the state of the gate capacitance GC of the transistor MP is maintained at P9. That is, the voltage Va at the gate terminal of the transistor MP is maintained at Vdd. Thus, the transistor MP becomes on.

When y=0 has been given as the first operation target data and x=0 is given as the second operation target data, the polarization state of the ferroelectric capacitor CF is maintained at P2 as shown in FIG. 5B. At this time, the state of the gate capacitance GC of the transistor MP is maintained at P10. That is, the voltage Va at the gate terminal of the transistor MP is maintained at Vdd. Thus, the transistor MP becomes on.

In the second stage OP2 of the operation process, since an "H" is given to the preset line PRE as shown in FIG. 2, the transistors M3 and M4 are on and off, respectively. Thus, the value of the output line ML differs depending on whether the transistor MP is on or off. That is, as shown in FIG. 1, the value of the output line ML becomes "L" or "H" depending on whether the transistor MP is on or off. When the values "L" and "H" of the output line ML are associated with a logic "0" and a logic "1", respectively, the relation among the first operation target data y, the second operation target data x and the value of the output line ML (the result of the logical operation) is as shown in FIG. 6A.

As can be understood from FIG. 6A, the logical operation circuit 1 performs a logical operation "ML=x AND y (AND of x and y)".

As shown in FIG. 2, the second stage OP2 of the operation process is followed by the third stage OP3. The process in the third stage OP3 is the same as the retention process described before, and hence its description is omitted here.

To obtain the ANDs of a first operation target data set y and a plurality of second operation target data sets x, after the first operation target data set y is written once as shown in FIG. 2, the operation process is performed on the plurality of second operation target data sets x. In such a case, since the first operation target data set y is not destroyed by the operation process, there is no need to rewrite the first operation target data set y.

When the first operation target data set y and the second operation target data set x are both different every time, a cycle consisting of a writing process, a retention process and an operation process is repeated.

Although first operation target data which cause the residual polarization states P1 and P2 are defined as y=1 and y=0, respectively, and second operation target data which cause the bit line BL to have "L" and "H" in the second stage OP2 of the operation process are defined as x=1 and x=0, respectively, so that a logical operation "ML=x AND y (AND of x and y)" can be performed as shown in FIG. 6A in the above embodiment, this invention is not limited thereto.

For example, when first operation target data which cause the residual polarization states P1 and P2 are defined as y=0 and y=1, respectively, and second operation target data which cause the bit line BL to have "L" and "H" in the second stage OP2 of the operation process are defined as x=0 and x=1, respectively, a logical operation "ML=x NOR y (NOR of x and y)" can be performed as shown in FIG. 6B.

Figure 7A:
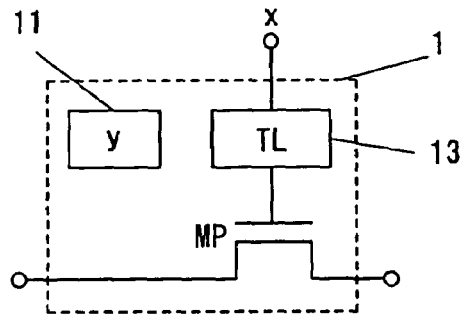
FIG. 7A is a block diagram illustrating the logical operation circuit 1 shown in FIG. 1.

FIG. 7A is a block diagram of the logical operation circuit 1 shown in FIG. 1. In FIG. 7A, the ferroelectric capacitor CF is represented as a memory function block 11 and the ferroelectric capacitor CF and the transistor MP are represented as a threshold operation function block 13. That is, the logical operation circuit 1 shown in FIG. 1 can be regarded as a circuit having a memory function block 11 for storing the first operation target data y, a threshold operation function block 13 for performing a logical operation on the second operation target data x and the first operation target data y, and a transistor MP which is controlled to be on or off according to the result of the logical operation.

Figure 7B:
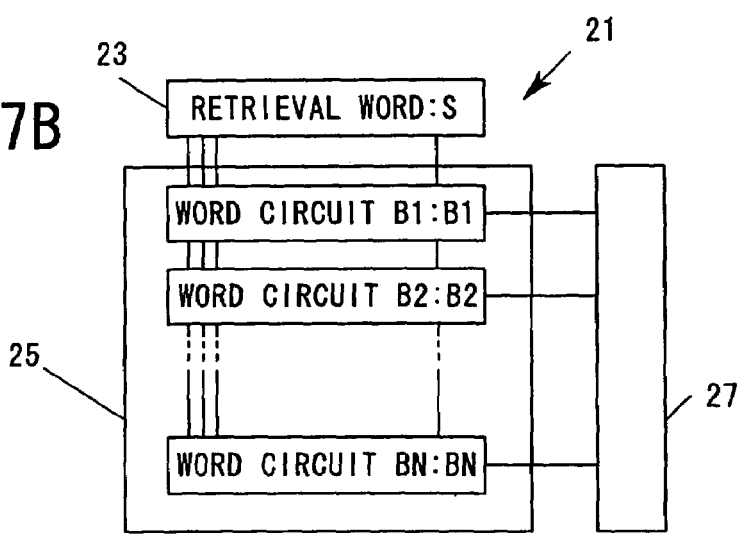
FIG. 7B is a block diagram illustrating a content addressable memory 21 using the logical operation circuits 1 shown in FIG. 1.

FIG. 7B is a block diagram illustrating a content addressable memory 21 using the logical operation circuits 1 shown in FIG. 1. The content addressable memory 21 has a retrieval word retaining section 23, a word circuit arrangement section 25, and an output circuit section 27. The retrieval word retaining section 23 retains a retrieval word S as a retrieving target. The word circuit arrangement section 25 has word circuits B1, B2, . . . , and Bn. The output circuit section 27 performs specified processing based on an output from the word circuit arrangement section 25.

Figure 7C:
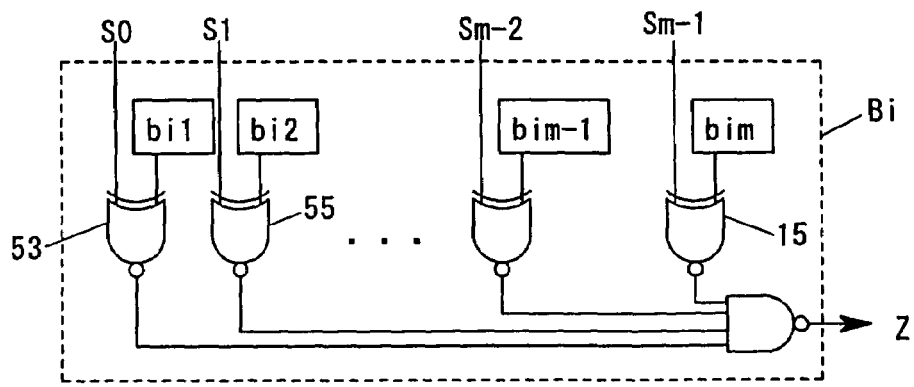
FIG. 7C is a view used to explain the logical processing of word circuits in the content addressable memory 21, taking a word circuit Bi as an example.

FIG. 7C is a view used to explain the logical processing in the word circuits, taking a word circuit Bi as an example. As can be understood from FIG. 7C, the word circuit Bi calculates "Z(S, Bi)" according to the following equation:

$$Z(S, Bi) = 0(S=Bi), 1(S \neq Bi) \qquad (9)$$

That is, in the word circuit Bi, when an m-bit retrieval word S and an m-bit reference words Bi completely coincide with each other, Z(S, Bi)=0, otherwise Z(S, Bi)=1.

Figure 8:
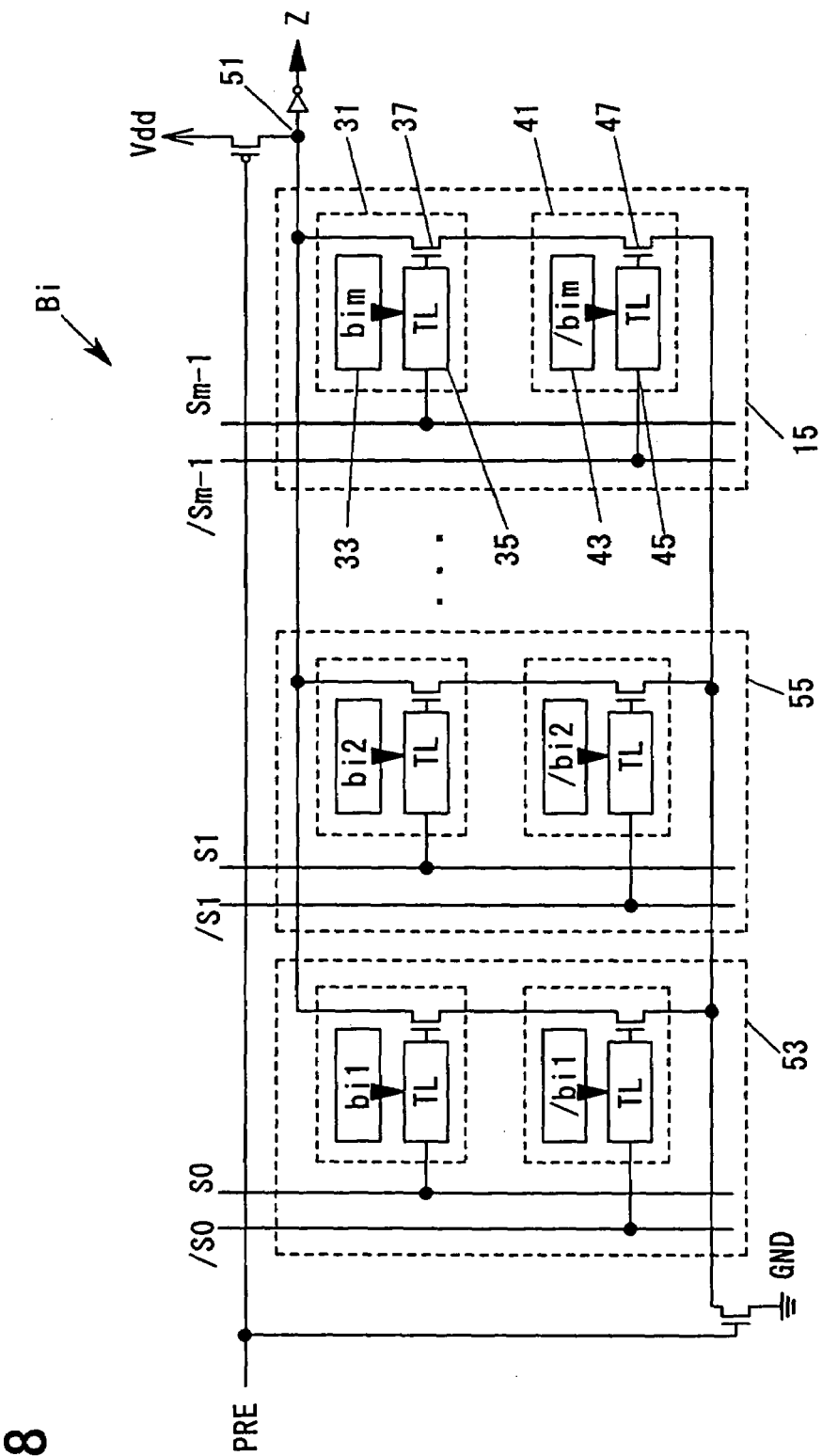
FIG. 8 is a circuit diagram of the word circuit Bi, shown in FIG. 7C, which is realized using the logical operation circuits 1.

FIG. 8 is a circuit diagram of the word circuit Bi shown in FIG. 7C, which is realized using the logical operation circuits 1. For example, a logical operation circuit 31, which has the same constitution as the logical operation circuit 1, has a memory function block 33 for storing first operation target data bim, a threshold operation function block 35 for calculating the AND of second operation target data sm−1 and the first operation target data bim, and a transistor 37 which is controlled to be on or off according to the result of the operation as shown in FIG. 8.

Similarly, a logical operation circuit 41 has a memory function block 43 for storing first operation target data /bim, a threshold operation function block 45 for calculating the AND of second operation target data /sm−1 and the first operation target data /bim, and a transistor 47 which is controlled to be on or off according to the result of the operation.

Since the transistors 37 and 47 are connected in series to each other, the OR of outputs from the transistors 37 and 47 is given to a node 51. That is, the logical operation circuits 31 and 41 connected in series to each other constitute an EXNOR circuit 15 (a circuit for obtaining the exclusive NOR of bim and sm−1).

Since the EXNOR circuit 15 is connected in parallel to an EXNOR circuit 53 (a circuit for obtaining the exclusive NOR of bi1 and s0), an EXNOR circuit 55 (a circuit for obtaining the exclusive NOR of bi2 and s1), . . . , which have the same constitution as the EXNOR circuit 15, the AND of the outputs from the EXNOR circuits 53, 55, . . . , and 15 is given to the node 51. Thus, z shown in the equation (9) can be obtained as the inversion output from the node 51.

As described above, a memory operation circuit such as a content addressable memory can be realized by using the logical operation circuits shown in FIG. 1.

Although the transistor MP is an N-channel MOSFET in the above embodiment, this invention is not limited thereto. For example, this invention is applicable when the transistor MP is a P-channel MOSFET.

Also in the above embodiments, the operation result output section has a field effect transistor as an output transistor which has a gate terminal connected to the first signal line and an output terminal for outputting an output signal corresponding to a control signal inputted into the gate terminal and which becomes off when a potential on the first reference potential side from its threshold voltage is given as the control signal and becomes on when a potential on the second reference potential side from its threshold voltage is given as the control signal, and the result of the logical operation is obtained as an output signal from the output transistor.

The first signal line can be connected to the second reference potential to precharge the first terminal of the ferroelectric capacitor retaining a polarization state corresponding to the first operation target data to the second reference potential. When the result of the logical operation is outputted, the first signal line is connected to the second reference potential and then the connection is released, then the second signal line is connected to the first or second reference potential corresponding to the second operation target data, and the result of the logical operation is outputted based on a potential which is generated in the first signal line when the second signal line is connected to the first or second reference potential corresponding to the second operation target data.

This invention, however, is not limited to the above constitution. For example, the first terminal of the ferroelectric capacitor CF may be precharged not to the second reference potential but to the first reference potential.

Although the operation result output section is constituted of a field effect transistor in the above embodiments, the operation result output section is not limited thereto. The operation result output section can be anything as long as it can output the result of a logical operation on the first and second operation target data based on a polarization state of the ferroelectric capacitor generated by providing the second operation target data to the ferroelectric capacitor.

Although a ferroelectric capacitor is used as a non-volatile memory element in the above embodiments, the non-volatile memory element in this invention is not limited to a ferroelectric capacitor. In general, an element having hysteresis characteristics can be used as a non-volatile memory element.

Figure 10A:
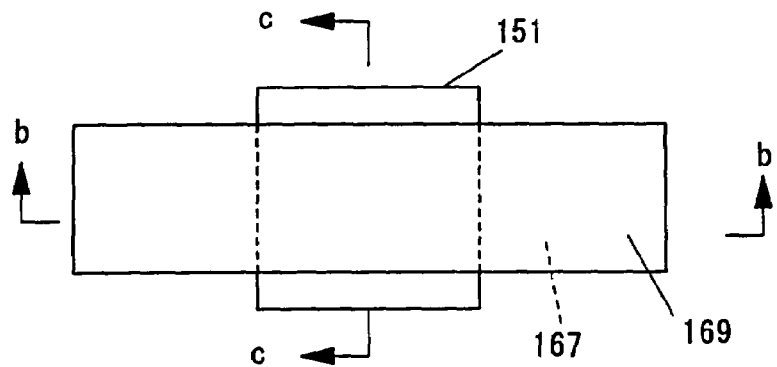
FIG. 10A is a plan view schematically illustrating a part of a logical operation circuit using a TMR element 151 as a non-volatile memory element.

FIG. 10A to FIG. 12B are views used to explain an example of a logical operation circuit using a TMR (tunnel magnetoresistance) element (tunnel magnetoresistive element) as a non-volatile memory element. FIG. 10A is a plan view schematically illustrating a part of a logical operation circuit using a TMR element 151 as a non-volatile memory element. FIG. 10B and FIG. 10C are cross-sectional views taken along the lines b-b and c-c, respectively, in FIG. 10A.

Figure 10B:
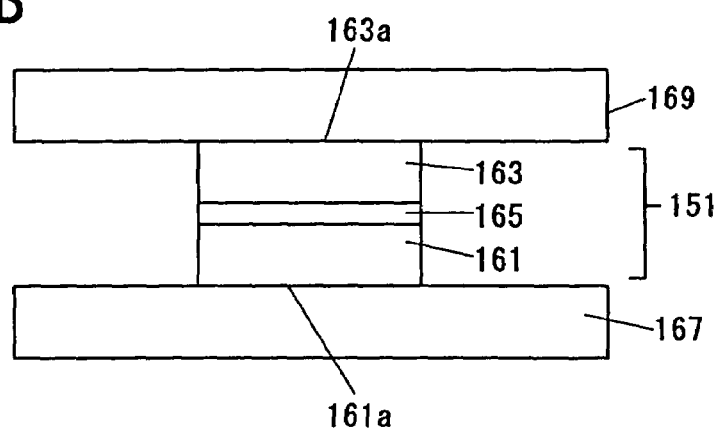
FIG. 10B and FIG. 10C are cross-sectional views taken along the lines b-b and c-c, respectively, in FIG. 10A.
Figure 10C:
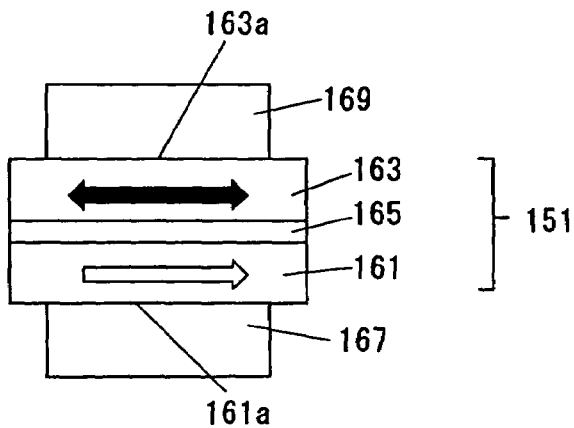

As shown in FIG. 10A to FIG. 10C, the TMR element 151 comprises a thin film like non-magnetic layer 165 of a dielectric material and a pair of ferromagnetic layers 161 and 163 of a ferromagnetic material. The ferromagnetic layers 161 and 163 are laminated with the non-magnetic layer 165 interposed therebetween. The TMR element 151 is interposed between a pair of input lines 167 and 169. The input lines 167 and 169 are arranged in contact with the ferromagnetic layers 161 and 163, respectively.

The input lines 167 and 169 correspond to the first and second signal lines, respectively. The portions of the ferromagnetic layers 161 and 163 in contact with the input lines 167 and 169 correspond to first and second terminals 161a and 163a, respectively, of the non-volatile element.

A current can be passed in a desired direction through the input lines 167 and 169. The ferromagnetic layer 163 is referred also to as a free layer. The magnetizing direction of the ferromagnetic layer 163 is changed depending on the combination of currents flowing through the input lines 167 and 169. The ferromagnetic layer 161 is referred also to as a fixed layer. The magnetizing direction of the ferromagnetic layer 161 is not changed by the currents flowing through the input lines 167 and 169. In this example, the magnetizing direction of the ferromagnetic layer 161 is fixed to the rightward direction (first magnetizing direction) in the drawing.

FIG. 11A to FIG. 11D are views used to explain the relation between the directions of currents IC1 and IC2 which are passed through the input lines 167 and 169, respectively, in a writing process and the changes in the magnetizing direction of the ferromagnetic layer 163. In FIG. 11A to FIG. 11D, IC1=0 represents that the current IC1 is flowing in a direction perpendicular to the plane of the drawing and toward the viewer, and IC1=1 represents that the current IC1 is flowing in a direction perpendicular to the plane of the drawing and away from the viewer. Also, IC2=0 represents that the current IC2 is flowing in a direction perpendicular to the plane of the drawing and toward the viewer, and IC2=1 represents that the current IC2 is flowing in a direction perpendicular to the plane of the drawing and away from the viewer. The directions of the magnetic fields generated around the input lines 167 and 169 are shown by the arcuate arrows.

Figure 11A:
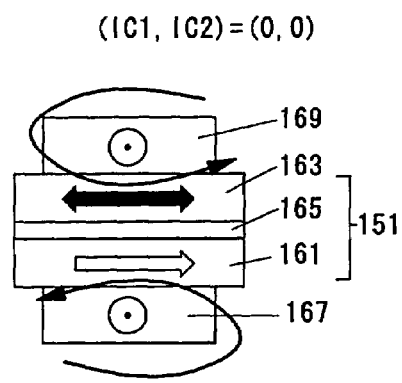
FIG. 11A to FIG. 11D are views used to explain the relation among the directions of currents IC1 and IC2 which are passed through input lines 167 and 169, respectively, in a writing process and the changes in the magnetizing direction of a ferromagnetic layer 163.
Figure 11B:
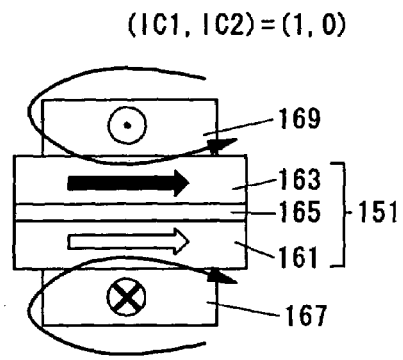
Figure 11C:
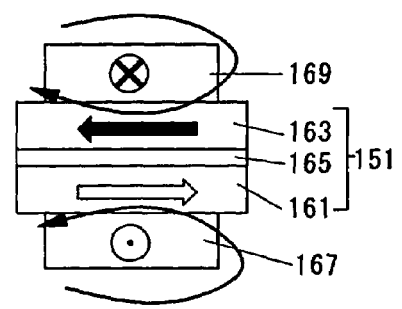
Figure 11D:
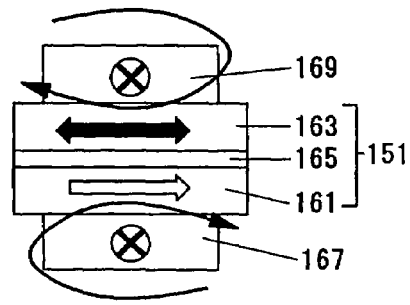

When the currents IC1 and IC2 are flowing in the same direction as shown in FIG. 11A and FIG. 11D, since the magnetic fields generated around the input lines 167 and 169 are cancelled by each other in an area in the vicinity of the TMR element 151, the magnetizing direction of the ferromagnetic layer 163 is not changed. That is, the content stored in the ferromagnetic layer 163 is not changed from that before a writing process.

On the other hand, when the current IC1 and IC2 are flowing in the opposite directions as shown in FIG. 11B and FIG. 11C, since the magnetic fields generated around the input lines 167 and 169 are enhanced by each other in an area in the vicinity of the TMR element 151, the magnetizing direction of the ferromagnetic layer 163 is changed to the rightward direction (first magnetizing direction) or the leftward direction (second magnetizing direction) in the drawings. That is, the content stored in the ferromagnetic layer 163 is renewed depending on the directions of the currents IC1 and IC2 by a writing process.

As described above, by controlling the currents IC1 and IC2, data can be written into the TMR element 151.

Figure 12A:
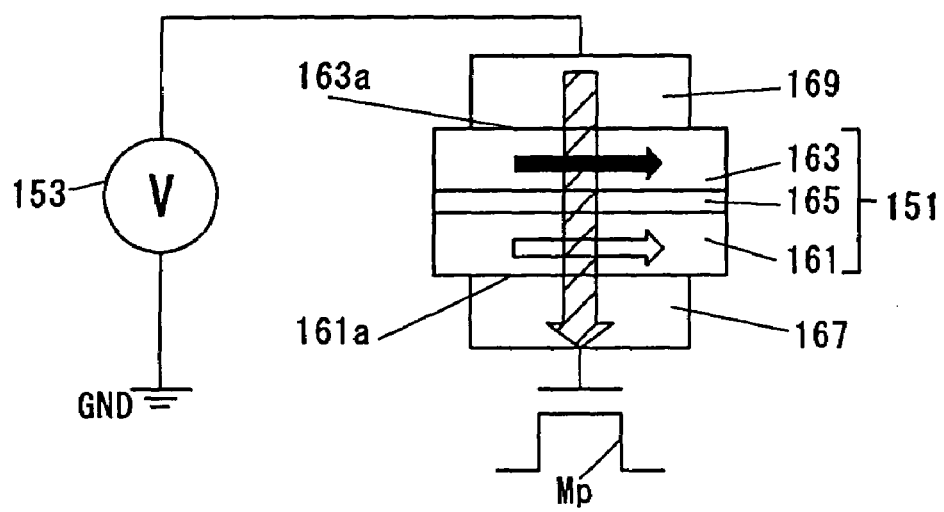
FIG. 12A and FIG. 12B are views used to explain a method for controlling the transistor MP based on data written into the TMR element 151 (a method for performing a reading process)
Figure 12B:
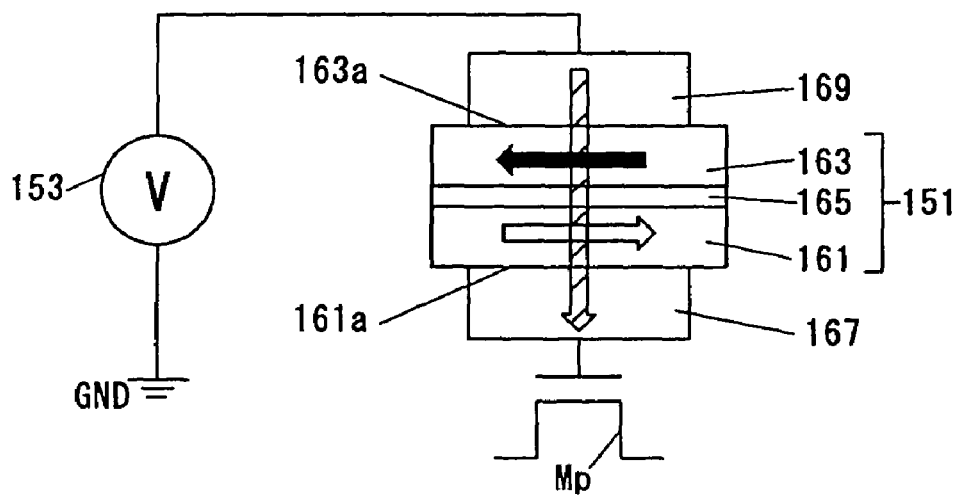

FIG. 12A and FIG. 12B are views used to explain a method for controlling the transistor MP based on data written into the TMR element 151, that is, a method for performing a reading process. The gate terminal of the transistor MP is connected to the terminal 161a of the TMR element 151 via the input line 167. The terminal 163a of the TMR element 151 is connected to a power source 153 via the input line 169.

The electrical resistance of the TMR element 151 is decreased when the magnetizing directions of the ferromagnetic layers 161 and 163 are the same and increases when the magnetizing directions of the ferromagnetic layers 161 and 163 are different by a tunnel magnetoresistive effect. Thus, as shown in FIG. 12A and FIG. 12B, when the voltage of the power source 153 is constant (the source voltage Vdd, for example), the current which flows through the TMR element 151 when the magnetizing direction of the ferromagnetic layer 163 is rightward is greater than the current which flows when the magnetizing direction of the ferromagnetic layer 163 is leftward. Using this, the transistor MP is controlled based on data written into the TMR element 151.

When the state in which the magnetizing direction of the ferromagnetic layer 163 after a writing process is rightward and the state in which the magnetizing direction of the ferromagnetic layer 163 after a writing process is leftward are associated with first and second operation target data y=1 and y=0, respectively, when the case in which the potential given to the input line 169 in a reading process is the source potential Vdd and the case in which the potential given to the input line 169 in a reading process is the ground potential GND are associated with second operation target data x=1 and x=0, respectively, and when the case in which the transistor MP becomes on in the reading process and the case in which the transistor MP becomes off in a reading process are associated with operation result data z=1 and z=0, respectively, the logical operation circuit of this embodiment satisfies the following relation as in the case with the before-mentioned logical operation circuit using a ferroelectric capacitor as a nonvolatile memory element:

z=x AND y.

In this specification, "A<=B" means that A is smaller than B or A is equal to B.

The "average capacitance of a ferroelectric capacitor in the inversion direction" herein means the average capacitance value which the ferroelectric capacitor has when its polarization state is shifted from a residual polarization state corresponding to first operation target data to a new polarization state generated by providing second operation target data to the ferroelectric capacitor and which is directed toward a polarization inversion.

Also, the "average capacitance of a ferroelectric capacitor in the non-inversion direction" herein means the average capacitance value which the ferroelectric capacitor has when its polarization state is shifted from a residual polarization state corresponding to first operation target data to a new polarization state generated by providing second operation target data to the ferroelectric capacitor and which is directed in a direction opposite the polarization inversion.

A logical operation circuit according to this invention comprises: a ferroelectric capacitor; a first signal line; a second signal line; and an operation result output section. The ferroelectric capacitor can retain a polarization state corresponding to first operation target data, and has first and second terminals. The first signal line is connected to the first terminal of the ferroelectric capacitor. The second signal line can provide second operation target data to the second terminal of the ferroelectric capacitor retaining the polarization state corresponding to the first operation target data, and is connected to the second terminal of the ferroelectric capacitor. The operation result output section can output the result of a logical operation on the first and second operation target data based on a polarization state of the ferroelectric capacitor generated by providing the second operation target data to the ferroelectric capacitor, and is connected to the first signal line.

A logical operation method comprising the steps of: causing a first ferroelectric capacitor having first and second terminals to retain a polarization state corresponding to first operation target data; charging the first terminal of the ferroelectric capacitor retaining the polarization state to a specified reference potential; and obtaining, based on a polarization state of the ferroelectric capacitor generated by providing second operation target data to the second terminal of the ferroelectric capacitor with the first terminal of the ferroelectric capacitor charged to the specified reference potential, the result of a logical operation on the first and second operation target data.

Thus, according to the above logical operation circuit or the logical operation method, when a polarization state of the ferroelectric capacitor and the result of a logical operation are associated with each other, it is possible to obtain, based on a new polarization state of the ferroelectric capacitor generated by providing the second operation target data to the ferroelectric capacitor retaining a polarization state corresponding to the first operation target data, the result of the logical operation on the first and second operation target data. That is, a logical operation can be performed on data using a ferroelectric capacitor.

In the logical operation circuit according to this invention, the first and second signal lines are connected to one of first and second reference potentials and the other of the first and second reference potentials, respectively, to generate the polarization state corresponding to the first operation target data in the ferroelectric capacitor.

Thus, any first operation target data can be stored in the ferroelectric capacitor via the first and second signal lines. Therefore, the first operation target data, as well as the second operation target data, can be rewritten as needed.

In the logical operation circuit according to this invention, the operation result output section has an output transistor which has a gate terminal connected to the first signal line and an output terminal for outputting an output signal corresponding to a control signal inputted into the gate terminal. The output transistor is an electric field effect transistor which becomes off when a potential on the first reference potential side from its threshold voltage is given as the control signal and becomes on when a potential on the second reference potential side from its threshold voltage is given as the control signal. The result of the logical operation is obtained as an output signal from the output transistor.

Thus, the output transistor becomes off when the potential generated in the first signal line based on a new polarization state of the first ferroelectric capacitor generated by providing the second operation target data to the ferroelectric capacitor retaining a polarization state corresponding to the first operation target data is on the first reference potential side from the threshold voltage and becomes on when the potential is on the second reference potential side from the threshold voltage. Thus, by properly setting the threshold voltage of the output transistor, the result of the logical operation can be obtained as an output signal from the output transistor.

In the logical operation circuit according to this invention, the first signal line can be connected to the second reference potential to precharge the first terminal of the ferroelectric capacitor retaining the polarization state corresponding to the first operation target data to the second reference potential. In the logical operation circuit, when the result of the logical operation is outputted, the first signal line is connected to the second reference potential and the connection is released, then the second signal line is connected to the first or second reference potential corresponding to the second operation target data, and the result of the logical operation is outputted based on a potential which is generated in the first signal line when the second signal line is connected to the first or second reference potential corresponding to the second operation target data.

Thus, when the second operation target data correspond to the second reference potential, the second potential is generated in the first signal line regardless of the content of the first operation target data. Thus, when the second operation target data correspond to the second reference potential, the output transistor becomes on regardless of the content of the first operation target data. On the other hand, when the second operation target data correspond to the first reference potential, two different potentials between the first and second reference potentials can be generated depending on the content of the first operation target data. Thus, when the threshold voltage of the output transistor is set to a value between the two different potentials, the output transistor becomes on or off depending on the content of the first operation target data when the second operation target data correspond to the first reference potential. That is, it is possible to perform a logical operation which causes the output transistor to be off only when the values of the first and second operation target data are in a particular combination.

A logical operation circuit according to this invention comprises: a ferroelectric capacitor having first and second terminals; first and second signal lines connected to the first and second terminals, respectively; and an output transistor. The output transistor is an electric field effect transistor which has a gate terminal connected to the first signal line and an output terminal for outputting an output signal corresponding to a control signal inputted into the gate terminal, and which becomes off when a potential on a first reference potential side from its threshold voltage is given as the control signal and becomes on when a potential on a second reference potential side from its threshold voltage is given as the control signal. In the logical operation circuit, the following operation is performed: The first and second signal lines are connected to one of the first and second reference potentials and the other of the first and second potentials, respectively, to generate a polarization state corresponding to first operation target data in the ferroelectric capacitor. The first and second signal lines are then both connected to the second reference potential to precharge the first signal line to the second reference potential without causing a change in the residual polarization state of the ferroelectric capacitor. Then, the application of voltage to the first signal line is stopped and the second signal line is connected to the first or second reference potential corresponding to second operation target data, and an output signal produced at the output terminal of the output transistor in response to a potential which is generated in the first signal line when the second signal line is connected to the first or second reference potential corresponding to the second operation target data is obtained as the result of a logical operation on the first and second operation target data.

Thus, by properly setting the threshold voltage of the output transistor, the result of the logical operation can be obtained as an output signal from the output transistor. That is, a logical operation can be performed using a ferroelectric capacitor.

In the logical operation circuit according to this invention, the absolute value Vath of the difference between the threshold voltage of the output transistor and the first reference potential is equal to or higher than the coercive electric field Vc of the ferroelectric capacitor and satisfies the following relation:

$$CG <= Pr/(Vd-Vc) \text{ and } CFnon/CG+1 < Vd/Vath$$

wherein
CG: the gate capacitance of the output transistor,
CFnon: the average capacitance of the ferroelectric capacitor in the non-inversion direction,
Pr: the residual polarization of the ferroelectric capacitor, and
Vd: the absolute value of the difference between the first and second reference potentials.

In the logical operation circuit according to this invention, the absolute value Vath of the difference between the threshold voltage of the output transistor and the first reference potential is smaller than the coercive electric field Vc of the ferroelectric capacitor and satisfies the following relation:

$$CFnon/CG+1 < Vd/Vath < CFrev/CG+1$$

wherein
CG: the gate capacitance of the output transistor,
CFnon: the average capacitance of the ferroelectric capacitor in the non-inversion direction,
CFrev: the average capacitance of the ferroelectric capacitor in the inversion direction, and
Vd: the absolute value of the difference between the first and second reference potentials.

Thus, according to either one of above logical operation circuits, the polarization state corresponding to the first operation target data is not inverted by providing the second operation target data even if the values of the first and second operation target data are in any combination. That is, a logical operation can be performed on any combination of the first and second operation target data without destroying the first operation target data even when the absolute value Vath of the difference between the threshold voltage of the output transistor and the first reference potential is equal to or higher than the coercive electric field Vc of the ferroelectric capacitor, or when the absolute value Vath is smaller than the coercive electric field Vc of the ferroelectric capacitor.

A logical operation circuit according to this invention comprises: a non-volatile memory element which can retain a non-volatile state corresponding to first operation target binary data y and which has first and second terminals; and an operation result output section which outputs, based on a state of the non-volatile memory element generated by providing second operation target binary data x to the second terminal of the non-volatile memory element, the result of a logical operation on the first and second operation target binary data x and y as operation result binary data z. The operation result binary data z substantially satisfies the following relation:

z=x AND y.

Thus, when a non-volatile state of the non-volatile memory element and the operation result data z are associated with each other, it is possible to obtain, based on a new non-volatile state of the non-volatile memory element generated by providing second operation target data x to the non-volatile memory element retaining a non-volatile state corresponding to first operation target data y, the AND of the first and second operation target data x and y. That is, a logical operation can be performed using a non-volatile memory element.

In the logical operation circuit according to this invention, the non-volatile memory element includes a ferroelectric capacitor and the non-volatile state is a residual polarization state of the ferroelectric capacitor. Thus, since a ferroelectric capacitor is used as the non-volatile memory element, a writing process can be performed on a low voltage at a high speed.

A logical operation circuit according to this invention comprises: a non-volatile memory element which can retain a non-volatile state corresponding to first operation target data; and an operation result output section which outputs, based on a state of the non-volatile memory element generated by providing second operation target data to the non-volatile memory element, the result of a logical operation on the first and second operation target data and which is connected to a first terminal of the non-volatile memory element.

Thus, when a non-volatile state of the non-volatile memory element and the result of a logical operation are associated with each other, it is possible to obtain, based on a new non-volatile state of the non-volatile memory element generated by providing second operation target data to the non-volatile memory element retaining a non-volatile state corresponding to first operation target data, the result of a logical operation on the first and second operation target data. That is, a logical operation can be performed using a non-volatile memory element.

A logical operation device according to this invention comprises a plurality of logical operation circuits of any of the above types which are arranges in series and/or parallel to perform a desired operation.

Since a multiplicity of the logical operation circuits, each of which can serve as a logical operation section and a storage section, are combined to perform a desired logical operation, it is possible to obtain a logical operation device which has a smaller circuit area, including the area for wiring, than a conventional logical operation device having a separate storage section does. Thus, the degree of integration in the device can be highly increased, and the power consumption of the device can be reduced. Also, since the storage is non-volatile, no power is required to retain the storage. Thus, power consumption during operation can be reduced, and little power is consumed during standby. Also, there is no need for a backup power source for power shutdown. In addition, when an element including a ferroelectric capacitor is used as a non-volatile memory element, a writing process can be performed at a high speed.

A logical operation device according to this invention comprises: a retrieval word retaining section for retaining a retrieval word as a retrieving target; and a word circuit for retaining a reference word as a referencing target and determining the coincidence between the reference word and the retrieval word, the word circuit comprising a plurality of logical operation circuits of any of the above types which are arranges in series and/or parallel.

Since a multiplicity of the logical operation circuits, each of which can serve as a logical operation section and a storage section, are combined to constitute a word circuit which determines the coincidence between a reference word and a retrieval word, it is possible to obtain a coincidence retrieval device which has a smaller circuit area, including the area for wiring, than a conventional coincidence retrieval device does. Thus, the degree of integration in the device can be highly increased, and the power consumption of the device can be reduced. Also, since the storage is non-volatile, no power is required to retain the storage. Thus, power consumption during operation can be reduced, and little power is consumed during standby. Also, there is no need for a backup power source for power shutdown. In addition, when an element including a ferroelectric capacitor is used as a non-volatile memory element, a writing process can be performed at a high speed.

In the logical operation device according to this invention, the word circuit calculates logical values corresponding to EXNORs of bit values of the reference word and corresponding bit values of the retrieval word using pairs of logical operation circuits connected in series for each of bits constituting the reference word, calculates a logical value corresponding to the AND of all the logical values corresponding to the EXNORs calculated for each of the bits by connecting all the outputs from the pairs of logical operation circuits in parallel, and provides the logical value corresponding to the AND as its coincidence determining output.

Thus, a coincidence output can be generated only when the reference word completely coincides with the retrieval word. It is, therefore, possible to constitute a highly-integrated, low-power consumption coincidence retrieval device which can determine whether a multiplicity of reference words coincide with a retrieval word and extract a reference word which completely coincides with the retrieval word from the multiplicity of reference words with ease.

While this invention has been described in its preferred embodiments, it is understood that the terminology employed herein is for the purpose of description and not of limitation and that changes and variations may be made without departing from the spirit and scope of the appended claims.

What is claimed is:

1. A logical operation circuit comprising:
   a ferroelectric capacitor which can retain a polarization state corresponding to first operation target data and which has first and second terminals;
   a first signal line connected to the first terminal;
   a second signal line which can provide second operation target data to the second terminal of the ferroelectric capacitor retaining the polarization state corresponding to the first operation target data and which is connected to the second terminal; and
   an operation result output selection which outputs the result of a logical operation on the first and second operation target data based on a polarization state of the ferroelectric capacitor generated by providing the second operation target data to the ferroelectric capacitor and which is connected to the first signal line.

2. The logical operation circuit as set forth in claim 1, wherein the first and second signal lines are connected to one of first and second reference potentials and the other of the first and second reference potentials, respectively, to generate the polarization state corresponding to the first operation target data in the ferroelectric capacitor.

3. The logical operation circuit as set forth in claim 1 or 2,
wherein the operation result output section has an electric field effect transistor as an output transistor which has a gate terminal connected to the first signal line and an output terminal for outputting an output signal corresponding to a control signal inputted into the gate terminal, and which becomes off when a potential on the first reference potential side from its threshold voltage is given as the control signal and becomes on when a potential on the second reference potential side from its threshold voltage is given as the control signal, and
wherein the result of the logical operation is obtained as an output signal from the output transistor.

4. A logical operation circuit comprising:
a ferroelectric capacitor which can retain a polarization state corresponding to first operation target data and which has first and second terminals
a first signal line connected to the first terminal;
a second signal line which can provide second operation target data to the second terminal of the ferroelectric capacitor retaining the polarization state corresponding to the first operation target data and which is connected to the second terminal; and
an operation result output selection which outputs the result of a logical operation on the first and second operation target data based on a polarization state of the ferroelectric capacitor generated by providing the second operation target data to the ferroelectric capacitor and which is connected to the first signal line,
wherein the first and second signal lines are connected to one of first and second reference potentials and the other of the first and second reference potentials, respectively, to generate the polarization state corresponding to the first operation target data in the ferroelectric capacitor,
wherein the operation result output section has an electric field effect transistor as an output transistor which has a gate terminal connected to the first signal line and an output terminal for outputting an output signal corresponding to a control signal inputted into the gate terminal, and which becomes off when a potential on the first reference potential side from its threshold voltage is given as the control signal and becomes on when a potential on the second reference potential side from its threshold voltage is given as the control signal, and
wherein the result of the logical operation is obtained as an output signal from the output transistor,
wherein the first signal line can be connected to the second reference potential to precharge the first terminal of the ferroelectric capacitor retaining the polarization state corresponding to the first operation target data to the second reference potential, and
wherein, when the result of the logical operation is outputted, the first signal line is connected to the second reference potential and the connection is released, then the second signal line is connected to the first or second reference potential corresponding to the second operation target data, and the result of the logical operation is outputted based on a potential which is generated in the first signal line when the second signal line is connected to the first or second reference potential corresponding to the second operation target data.

5. A logical operation circuit comprising:
a ferroelectric capacitor having first and second terminals;
first and second signal lines connected to the first and second terminals, respectively; and an electric field effect transistor as an output transistor which has a gate terminal connected to the first signal line and an output terminal for outputting an output signal corresponding to a control signal inputted into the gate terminal, and which becomes off when a potential on a first reference potential side from its threshold voltage is given as the control signal and becomes on when a potential on a second reference potential side from its threshold voltage is given as the control signal,
wherein the first and second signal lines are connected to one of the first and second reference potentials and the other of the first and second potentials, respectively, to generate a polarization state corresponding to first operation target data in the ferroelectric capacitor,
the first and second signal lines are then both connected to the second reference potential to precharge the first signal line to the second reference potential without causing a change in the residual polarization state of the ferroelectric capacitor, and
the application of voltage to the first signal line is stopped and the second signal line is connected to the first or second reference potential corresponding to second operation target data, and an output signal produced at the output terminal of the output transistor in response to a potential which is generated in the first signal line when the second signal line is connected to the first or second reference potential corresponding to the second operation target data is obtained as the result of a logical operation on the first and second operation target data.

6. The logical operation circuit as set forth in claim 5,
wherein the absolute value Vath of the difference between the threshold voltage of the output transistor and the first reference potential is equal to or higher than the coercive electric field Vc of the ferroelectric capacitor and satisfies the following relation:

$CG<=Pr/(Vd-Vc)$ and $CFnon/CG+1<Vd/Vath$ wherein
CG: the gate capacitance of the output transistor,
CFnon: the average capacitance of the ferroelectric capacitor in the non-inversion direction,
Pr: the residual polarization of the ferroelectric capacitor, and
Vd: the absolute value of the difference between the first and second reference potentials.

7. The logical operation circuit as set forth in claim 5,
wherein the absolute value Vath of the difference between the threshold voltage of the output transistor and the first reference potential is smaller than the coercive electric field Vc of the ferroelectric capacitor and satisfies the following relation:

$CFnon/CG+1<Vd/Vath<CFrev/CG+1$ wherein
CG: the gate capacitance of the output transistor,
CFnon: the average capacitance of the ferroelectric capacitor in the non-inversion direction,
CFrev: the average capacitance of the ferroelectric capacitor in the inversion direction, and
Vd: the absolute value of the difference between the first and second reference potentials.

8. A logical operation circuit comprising:
a non-volatile memory element which can retain a non-volatile state corresponding to first operation target binary data y and which has first and second terminals; and an operation result output section which outputs, based on a state of the non-volatile memory element generated by providing second operation target binary data x to the second terminal of the non-volatile memory element, the result of a logical operation on the first and second operation target binary data x and y as operation result binary data z, wherein the operation result binary data z substantially satisfies the following relation:

z=x AND y.

9. The logical operation circuit as set forth in claim 8, wherein the non-volatile memory element includes a ferroelectric capacitor and the non-volatile state is a residual polarization state of the ferroelectric capacitor.

10. A logical operation device comprising:
a retrieval word retaining section for retaining a retrieval word as a retrieving target; and
a word circuit for retaining a reference word as a referencing target and determining the coincidence between the reference word and the retrieval word,
the word circuit comprising a plurality of logical operation circuits comprising:
a non-volatile memory element which can retain a non-volatile state corresponding to first operation target data; and
an operation result output section which outputs, based on a state of non-volatile memory element generated by providing second operation target data to the non-volatile memory element, the result of a logical operation on the first and second operation target data and which is connected to a first terminal of the non-volatile memory element,
which are arranged in series and/or parallel.

11. The logical operation device as set forth in claim 10, wherein the word circuit calculates logical values corresponding to EXNORs of bit values of the reference word and corresponding bit values of the retrieval word using pairs of logical operation circuits connected in series for each of bits constituting the reference word, calculates a logical value corresponding to the AND of all the logical values corresponding to the EXNORs calculated for each of the bits by connecting all the outputs from the pairs of logical operation circuits in parallel, and provides the logical value corresponding to the AND as its coincidence determining output.

12. A logical operation circuit comprising:
a ferroelectric capacitor retaining the polarization state corresponding to first operation target data and which has first and second terminals;
a first signal line connected to the first terminal;
a second signal line which can provide second operation target date to the second terminal of the ferroelectric capacitor retaining the polarization state corresponding to the first operation target data and which is connected to the second terminal; and
an operation result output selection which outputs the result of a logical operation on the first and second operation target data based on a polarization state of the ferroelectric capacitor generated by providing the second operation target data to the ferroelectric capacitor and which is connected to the first signal line, wherein the operation result output section has an electric field effect transistor as an output transistor which has a gate terminal connected to the first signal line and an output terminal for outputting an output signal corresponding to a control signal inputted into the gate terminal, and which becomes off when a potential on the first reference potential side from its threshold voltage is given as the control signal and becomes on when a potential on the second reference potential side from its threshold voltage is given as the control signal, and wherein the result of the logical operation is obtained as an output signal from the output transistor, wherein the first signal line can be connected to the second reference potential to precharge the first terminal of the ferroelectric capacitor retaining the polarization state corresponding to the first operation target data to the second reference potential, and wherein, when the result of the logical operation is outputted, the first signal line is connected to the second reference potential and the connection is released, then the second signal line is connected to the first or second reference potential corresponding to the second operation target data, and the result of the logical operation is outputted based on a potential which is generated in the first signal line when the second signal line is connected to the first or second reference potential corresponding to the second operation target data.

* * * * *